(12) United States Patent
Tsai et al.

(10) Patent No.: US 6,424,005 B1
(45) Date of Patent: Jul. 23, 2002

(54) LDMOS POWER DEVICE WITH OVERSIZED DWELL

(75) Inventors: Chin-Yu Tsai, HsinChu Hsien (TW); Taylor R. Efland; Sameer Pendharkar, both of Richardson, TX (US); John P. Erdeljac, Plano, TX (US); Jozef Mitros, Richardson, TX (US); Jeffrey P. Smith; Louis N. Hutter, both of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/205,657

(22) Filed: Dec. 3, 1998

(51) Int. Cl.[7] ............................. H01L 31/113
(52) U.S. Cl. ................ 257/335; 257/283; 257/336; 257/344; 257/345
(58) Field of Search ................ 257/335, 283, 257/336, 344, 345

(56) References Cited

U.S. PATENT DOCUMENTS

| | | | | |
|---|---|---|---|---|
| 5,304,827 A | * | 4/1994 | Malhi et al. ............... | 257/262 |
| 5,348,895 A | * | 9/1994 | Smayling et al. ............. | 437/54 |
| 5,536,959 A | * | 7/1996 | Kellam ...................... | 257/327 |
| 5,812,006 A | * | 9/1998 | Teggatz et al. ............. | 327/309 |
| 5,859,456 A | * | 1/1999 | Efland et al. ............... | 257/335 |
| 5,895,237 A | * | 4/1999 | Chan et al. .................. | 438/225 |
| 5,939,755 A | * | 8/1999 | Takeuchi et al. ............ | 257/347 |
| 6,137,140 A | * | 10/2000 | Efland et al. ............... | 257/343 |
| 6,172,401 B1 | * | 1/2001 | Brand ........................ | 257/344 |

* cited by examiner

Primary Examiner—Stephen D. Meier
Assistant Examiner—James Mitchell
(74) Attorney, Agent, or Firm—Jacqueline J. Garner; W. James Brady, III; Frederick J. Telecky, Jr.

(57) ABSTRACT

An LDMOS device (10, 20, 50, 60) that is made with minimal feature size fabrication methods, but overcomes potential problems of misaligned Dwells (13). The Dwell (13) is slightly overstated so that its n-type dopant is implanted past the source edge of the gate region (18), which permits the n-type region of the Dwell to diffuse under the gate region (18) an sufficient distance to eliminate misalignment effects.

11 Claims, 4 Drawing Sheets

| SPECIFICATION RATED BV$_{dss}$ | V$_{gs}$=10.0V (mΩ·cm$^2$) | V$_{gs}$=12.75V (mΩ·cm$^2$) | V$_{gs}$=15.0V (mΩ·cm$^2$) | BV (V) |
|---|---|---|---|---|
| 60V (LOW SIDE) | 1.05 | 0.95 | 0.90 | 69.3 |
| 60V (HIGH SIDE) | 1.26 | 1.13 | 1.05 | 70.1 |
| 40V (HS AND LS) | 0.75 | 0.68 | 0.63 | 50.0 |
| 25V (HS AND LS) | 0.50 | 0.45 | 0.43 | 33.0 |
| 16V (HS AND LS) | 0.41 | 0.36 | 0.34 | 19.0 |

# LDMOS POWER DEVICE WITH OVERSIZED DWELL

TECHNICAL FIELD OF THE INVENTION

This invention relates to semiconductor devices, and more particularly, to an LDMOS (lateral double-diffused metal oxide semiconductor) deice having an oversized DWELL to compensate misalignment during is manufacture.

BACKGROUND OF THE INVENTION

DMOS devices are "double diffused" MOS (metal oxide semiconductor) transistor devices. A DMOS device is characterized by a source region and a backgate region, which are diffused at the same time. The transistor channel is formed by the difference in the two diffusions, rather than by separate implantation. DMOS devices have the advantage of decreasing the length of the channel, thereby providing low-power dissipation and high-speed capability.

DMOS devices may have either lateral or vertical configurations. A DMOS device having a lateral configuration (referred to herein as an LDMOS), has its source and drain at the surface of the semiconductor wafer. Thus, the current is lateral.

In general, an LDMOS is designed for a desired breakdown voltage (BV) and a low specific on-resistance (Rsp). In general, the design goal is to keep Rsp as low as possible for a given voltage range. The Rsp is a widely used figure of merit, and is the product of the on- resistance, Ron, and the area of the transistor cell, Area:

Rsp=Ron * Area

The source to drain spacing is directly related to Ron, with a larger spacing resulting in larger Ron.

It is desirable to have an LDMOS that is rated for multiple voltage, i.e., 16–60 volts. However, it is difficult to provide such a device having both the desired voltage characteristic and low Rsp.

SUMMARY OF THE INVENTION

One aspect of the invention is an LDMOS device having an oversized DWELL. Various embodiments of the invention provide high, medium, and low voltages LDMOS devices, and high-side and low-side variations.

For the high voltage, low-side embodiment, the device is formed on a p-type semiconductor layer. A deep Nwell is formed in the semiconductor layer and contains the device. A Dwell is formed in the Nwell. This Dwell has a p-type region and a shallower n-type region. An n+ source region is formed in the Dwell and an n+ drain region is formed in the Nwell, with the source region and the drain region being spaced apart such that a channel is formed between them. A p+ backgate region is formed in the Dwell adjacent the source region such that the source region separates the backgate region and the channel. A p+ anode region is formed between the drain region and the channel region. A gate oxide layer is formed over the channel and a gate is formed over at least part of the source region and the channel. The Dwell is oversized in the sense that it is implanted past the source edge of the gate. As a result, not only does its p-type region diffuse under the gate, but also its shallow n-type region diffuses well past the source edge of the gate.

An advantage of the invention is that the LDMOS may be manufactured using an 0.72 μm (micron) BiCMOS fabrication process with a photo-aligned Dwell. By using an oversized Dwell, a reduction in size and junction depth of the source and drain regions, with the accompanying reduction in junction depth of the n-type region of the Dwell, can be accomplished without Dwell misalignment problems and other adverse effects. The LDMOS has excellent BV vs Rsp characteristics as well as reduced die area.

DETAILED DESCRIPTION OF THE INVENTION

Figure 1:
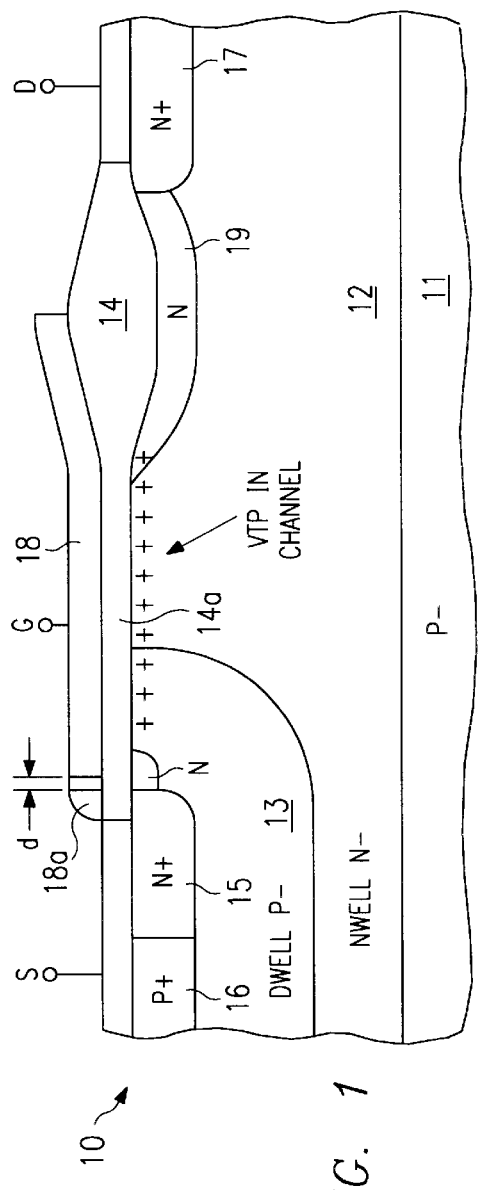
FIG. 1 is a cross sectional view of a high voltage low-side LDMOS device in accordance with the invention.

FIG. 1 is a cross-sectional view of a single transistor of an LDMOS device 10 in accordance with the invention. Although only a single transistor is shown, an actual LDMOS device 10 will be comprised of numerous transistors 10 fabricated according to a layout that is optimized for manufacturing efficiency and device quality. Thus, where FIG. 1 illustrates a "region" of a single transistor, that region is actually part of a patterned layer that forms the same region for numerous other transistors.

In the example of FIG. 1, LDMOS 10 is a non-planar type of LDMOS device, which means that each transistor has a thick field oxide region 14 between its source region and its drain. The invention may also be implemented with planar LDMOS devices, as described below in connection with FIG. 6.

LDMOS 10 may be fabricated using linear BiCMOS manufacturing techniques, such as those developed by Texas Instruments Incorporated. The fabrication process employs various known semiconductor fabrication techniques. Various materials are deposited, grown,. or implanted, in layers on a substrate. The layers may be in patterns as defined by a photoresist pattern or otherwise.

In the example of this description, a 0.72 μm process is used, meaning that 0.72 μm is the minimum feature size. This is a smaller feature size than for previous LDMOS devices. A result of this smaller feature size is a shallowing of the p-type backgate region 16, which requires the n-type region of Dwell 13 to also be shallower so as to ensure good contact of the backgate region) 16 through the arsenic to the p-type region of Dwell 13. The present invention avoids misalignment problems that can result from this shallowing of the n-type region of Dwell 13. With proper alignment, the gate region 18 should extend slightly past the channel over the source n+ region 15.

A non-planar LDMOS device, without the features of the present invention, is described in U.S. patent application Ser. No. 08/353,865 (Atty Dkt No. 18836), to Efland, et al., entitled "Medium Voltage LDMOS Device and Method of Fabrication". Other types of LDMOS devices, without the features of the present invention, are described in U.S. Pat. No. 5,585,657, to Efland, et al., entitled "Windowed and Segmented Linear Geometry Source Cell for Power DMOS Processes", and in U.S. patent application Ser. No. 60/047,474, to Tsai, et al., entitled "Reduced Surface Drain (RSD) LDMOS Power Device". Each of these inventions are assigned to Texas Instruments Incorporated, and the patent and patent applications are incorporated by reference herein.

In the example of this description, LDMOS 10 is a "low side" 60 V (volt) device, where the 60 V specification refers to its rated breakdown voltage. As explained below in connection with FIG. 2, LDMOS 10 can be slightly modified to provide a "high side" 60 V device. A "low side" LDMOS is distinguished from a "high side" LDMOS by the voltage on the transistor source. For a "low side" LDMOS, the source is grounded, whereas for a "high side" device, the voltage is applied to the source.

LDMOS 10 is fabricated on a silicon substrate 11 of a first conductivity type. In the example of this description, the first conductivity type for the substrate 11 is assumed to be a p type, as is typical for LDMOS devices. However, as is the case for MOS devices in general, the use of p and n type semiconductor regions may be reversed. In general, reference can be made to a p type semiconductor region as having a first conductivity and an n type semiconductor region as having a second conductivity, or vice versa.

Then, a deep well 12 of a second conductivity type, here an n type, is diffused on substrate 11. As is the case with conventional LDMOS devices, the transistor elements of device 10 are fabricated inside this Nwell 12. The Nwell 12 is a high voltage, low concentration, deep diffusion well that isolates the numerous transistor that may be formed on the same semiconductor wafer from each other.

A p-type and n-type dopant are co-implanted and diffused at the same time to create a double-diffused well (Dwell) 13 having both n-type and p-type layers, which form the basis of the source and channel for each device 10. Dwell 13 is a "solid" type Dwell as compared to "donut" type Dwell used in other LDMOS designs. The channel of LDMOS 10 is formed as the difference in lateral diffusions of the two co-implanted regions of its Dwell 13.

Dwell 13 is formed using a photo-alignment process, which permits it to be implanted and diffused prior to formation of the polysilicon gate layer 18. However, because it is photo-aligned rather than self-aligned to the polysilicon layer 18, misalignment of these two layers can occur. As stated above, the relationship between the edge of the polysilicon layer 18 and the edge of the n-type source region 15 is important to proper operation of an LDMOS transistor.

Dwell 13 is slightly oversized with respect to an opening above it that will be formed in a subsequently deposited polysilicon layer 18. In other words, as compared to prior LDMOS designs, the size of Dwell 13 is increased by offsetting the Dwell mask a distance, d, from the edge of the polysilicon layer 18.

Figure 1A:
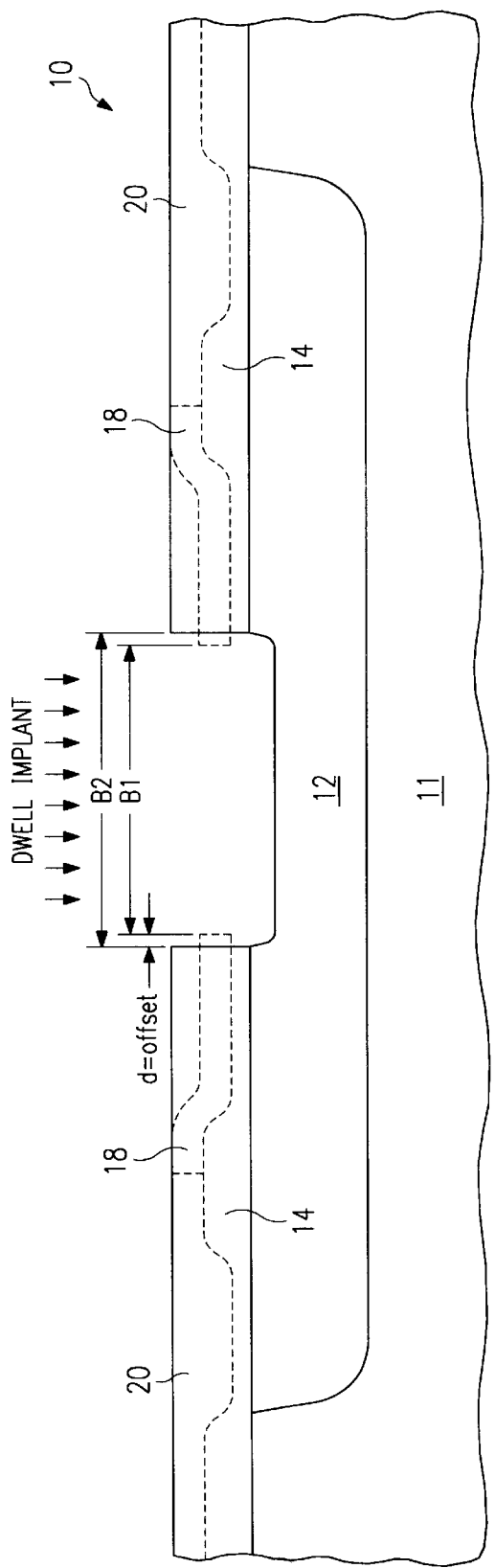
FIG. 1A is a cross sectional view of the device of FIG. 1 during fabrication.

FIG. 1A illustrates LDMOS 10 during fabrication, specifically, the Dwell mask prior to the diffusion of the Dwell 13. A photoresist layer 20 has been patterned to form the Dwell mask. The field oxide layer 14 and poly gate layer 18, which are to subsequently deposited are shown in dotted lines. Instead of placing the Dwell mask at boundary B1, which coincides with the boundary of the opening in poly layer 18, it is placed at B2, a distance, d, farther from the boundary of the poly layer 18. In the example of this description, d is 0.2 μm. As a result, the Dwell is implanted in a larger area, which extends under what will subsequently be the gate region 18.

Referring again to FIG. 1, during diffusion, the p-type and n-type regions of Dwell 13 diffuse laterally as well as vertically. The p-type diffuses more than the n-type resulting in the p-type channel region.

The n-type region (typically arsenic) of Dwell 13 stabilizes the threshold voltage, $V_T$, and defines the channel length. A feature of the invention is that this n-type region is shallow as compared to other LDMOS devices. In the example of this description, its depth is 0.1 μm (micron; micrometer), resulting in a lateral diffusion outward from the mask boundary (at B2) of approximately 0.1 μm.

The transistor's drift region, which is under the thick field oxide region 14, may be implanted with an n-type channel stop region 19. This channel stop region 19 is formed with a blanket implant and aids in reducing resistance in the drift region.

A p-type blanket implant, shown as VTP in FIG. 1, may be made in the channel region. It provides a threshold voltage adjust, and in the example of this description, normalizes $V_T$ to 1.5 V with a gate oxide. thickness of 425 Å.

A thick field oxide layer 14 is grown and patterned with photoresist. As illustrated, this layer 14 results in a thick field oxide region 14 that will separate the source (S) and drain (D) of each LDMOS transistor 10. A thin gate oxide layer 14a is formed over the channel region.

Next, a polysilicon gate region 18 is deposited and etched over the gate oxide 14a and field oxide region 14 as shown. It is doped to make it conductive. Because of the offset of Dwell 13, the edge of the polysilicon gate region 18 is not coincident with the edge of Dwell 13.

As a result of both the offset of Dwell 13 and the lateral diffusion of its n-type layer, misalignment of Dwell 13 to poly gate region 18 can be compensated. In the example of this description, where the offset, d, of Dwell 13 is 0.2 μm and the lateral diffusion of the n-type layer of Dwell 13 is 0.1 μm, the n-type layer of Dwell 13 extends under the poly gate region 18 by 0.3 μm. This permits a misalignment of up to 0.3 μm to be compensated. The stabilization function (described above) of the n-type layer of Dwell 13 is thereby maintained even though that layer is shallow.

In the example of this description, the Dwell portion of the channel region is 1 μm. Thus, the 0.3 μm extension of the n-type region of Dwell 13 under the gate region 18 is approximately one-third of the channel length.

Next, n+ regions are patterned and implanted to form source region 15 and drain region 17. As illustrated, source region 15 is placed in the Dwell 13, such that the channel separates source region 15 from drain region 17. Source region 15 is also shallow, and in this example has a depth of 0.3 μm. A sidewall 18a is used as a mask for the n+ implant for the source region 15. A p+ backgate region 16 is formed adjacent to source region 15.

Figure 2:
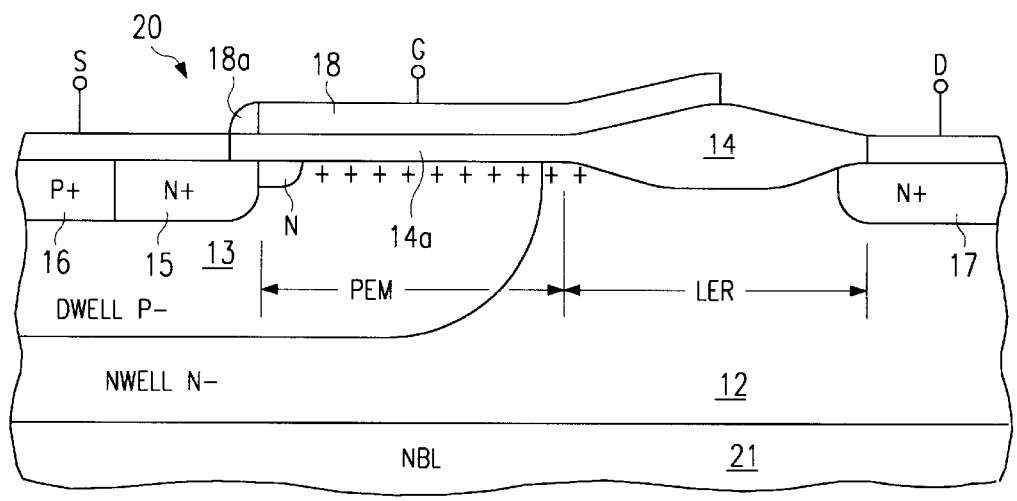
FIG. 2 is a cross sectional view of a high voltage high-side embodiment of the invention.

FIG. 2 illustrates a variation of an LDMOS in accordance with the invention, a "high side" LDMOS device 20. LDMOS 20 has a buried n-type barrier layer 21, which replaces the p-type substrate 11 of device 10. This barrier layer 21 prevents punchthrough from Dwell 13 to the substrate. LDMOS 20 has no n-type channel stop region 19 as does LDMOS 10.

Referring to both FIGS. 1 and 2, LDMOS 10 and LDMOS 20 have BV and Rsp characteristics that can be affected by the distance under the field oxide region 14 between the source and drain (identified on FIG. 2 as the LER length) and the extension of the poly gate region 18 into the source moat region (identified on FIG. 2 as the PEM length).

Figure 3:
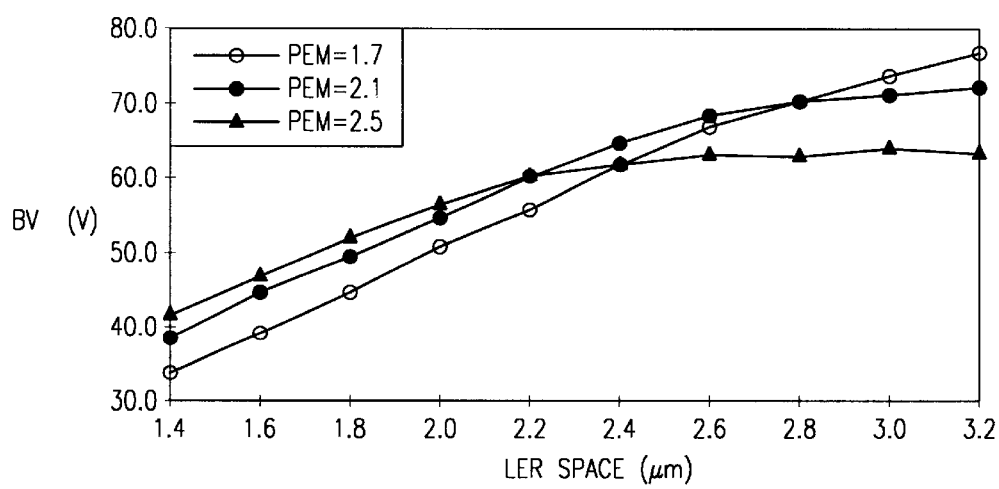
FIGS. 3 and 4 illustrate the Rsp and BV characteristics of the embodiment of FIG. 1 for varying channel and drift region configurations.
Figure 4:
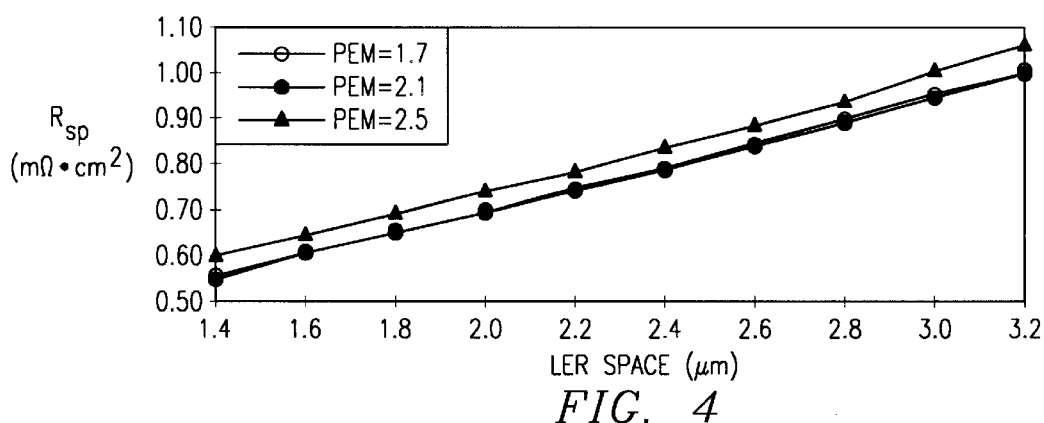

FIGS. 3 and 4 illustrate, for LDMOS 10, the effect on BV and Rsp, respectively, from varying LER for given PEM lengths. For short LER, BV is determined by depletion limits and consequential high field build-up at the surface junction. As LER is increased past the maximum spacing required for full depletion, BV becomes more limited by surface junction breakdown at the gate oxide region 14a. In this case, a short PEM is desirable because it pushes depletion to the n-type side and effectively reduces the field. The Rsp is fairly linear with variation in LER. Although difficult to discern from FIG. 4, at PEM=1.7 μm and PEM=2.1 μm, Rsp is substantially the same over the LER range. In general, increasing LER increases Rsp by increasing both area and the drift region, which is highly resistive.

Similar experimentation has been performed to determine the effect on BV and Rsp of varying PEM. BV curves follow an increase then decrease, due to the breakdown mechanisms discussed in the preceding paragraph. Rsp curves are flatter for PEM spacing variations than for LER spacing; increasing PEM affects Rsp only slightly. The optimum PEM spacing is in the range of 1.9 μm to 2.1 μm.

Similar BV and Rsp analysis can be made to optimize the high side LDMOS 20. With a barrier layer, BV saturates at about 55 V with LER=2.2 μm. To provide a 60V device with satisfactory Rsp, the channel stop region 19 is omitted (or masked).

Figure 5:
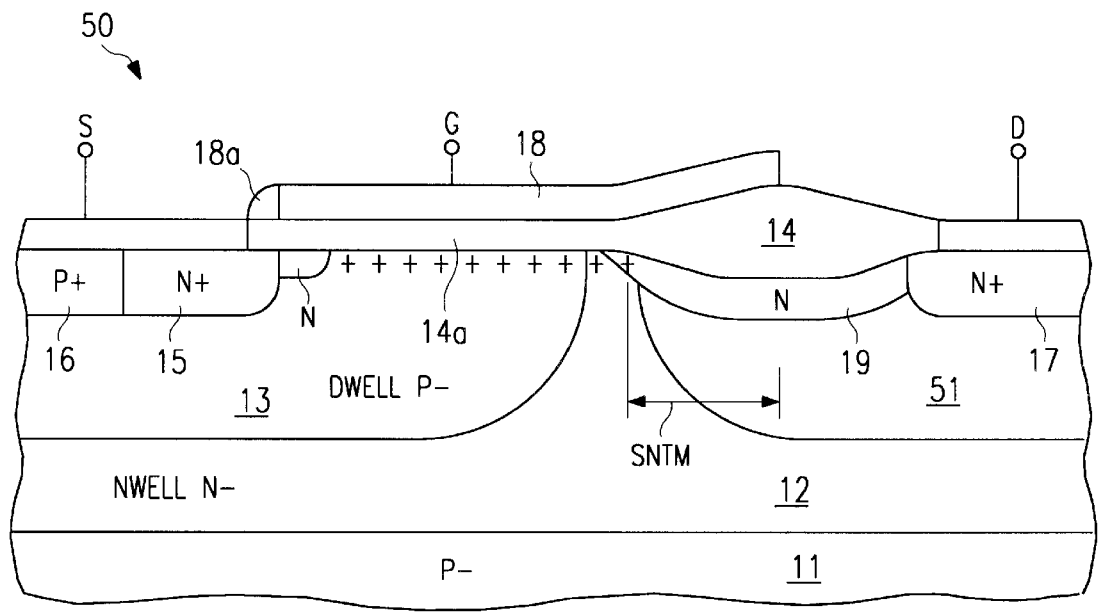
FIG. 5 is a cross sectional view of a medium voltage low-side embodiment of the invention.

FIG. 5 illustrates another variation of an LDMOS in accordance with the invention, a medium voltage LDMOS 50. An example of a medium voltage rating is 25 V. LDMOS 50 modifies the LDMOS 10 of FIG. 1 by the addition of a shallow Nwell 51 in the drift region. The butting action of the shallow Nwell 51 to Dwell 13 limits the breakdown voltage. Also, the shallow Nwell 51 decreases Rsp. The spacing of the shallow Nwell 51 to the source moat region is indicated on FIG. 5 as SNTM. As this space decreases and the shallow Nwell 51 encroaches on the Dwell 13, the breakdown voltage decreases.

In FIG. 5, LDMOS 50 is shown as a "low side" device. It can be made a "high side" device by replacing layer 11 with a barrier layer, such as the barrier layer 21 of FIG. 2.

Figure 6:
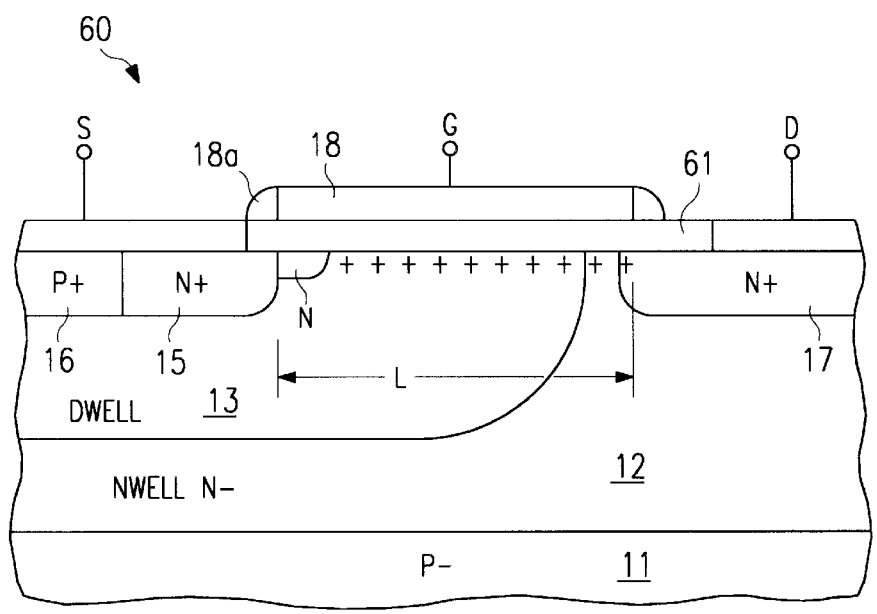
FIG. 6 is a cross sectional view of a low voltage low-side embodiment of the invention.

FIG. 6 illustrates a low voltage LDMOS 60. An example of a low voltage rating is 16V. Unlike the LDMOS devices described in the preceding paragraphs, LDMOS 60 is a planar device. In other words, it lacks the thick field oxide regions 14 of the non-planar LDMOS devices 10, 20, and 50. Instead, the planar gate oxide layer 61 extends over the drift region. An example of a planar LDMOS, without the features of the present invention, is described in U.S. patent Ser. No. 60/047,474, referenced above.

LDMOS 60 has a drift region that is minimal in distance. Its channel length is minimized at the punch-through limit. As the length, L, of the polysilicon gate region 18 decreases, the Rsp and BV also increase. LDMOS 60 is shown having a lightly doped drain (LDD) implant, but this implant is optional. Because the most voltage is dropped across the gate oxide layer 61, the BV of LDMOS 60 is dependent on long term reliability of the gate oxide. Like the medium voltage LDMOS 50, the low voltage LDMOS 60 can be modified by the substitution of a barrier layer, such as barrier layer 21 in FIG. 1, to provide a high side low voltage LDMOS.

Figures 7, 8:
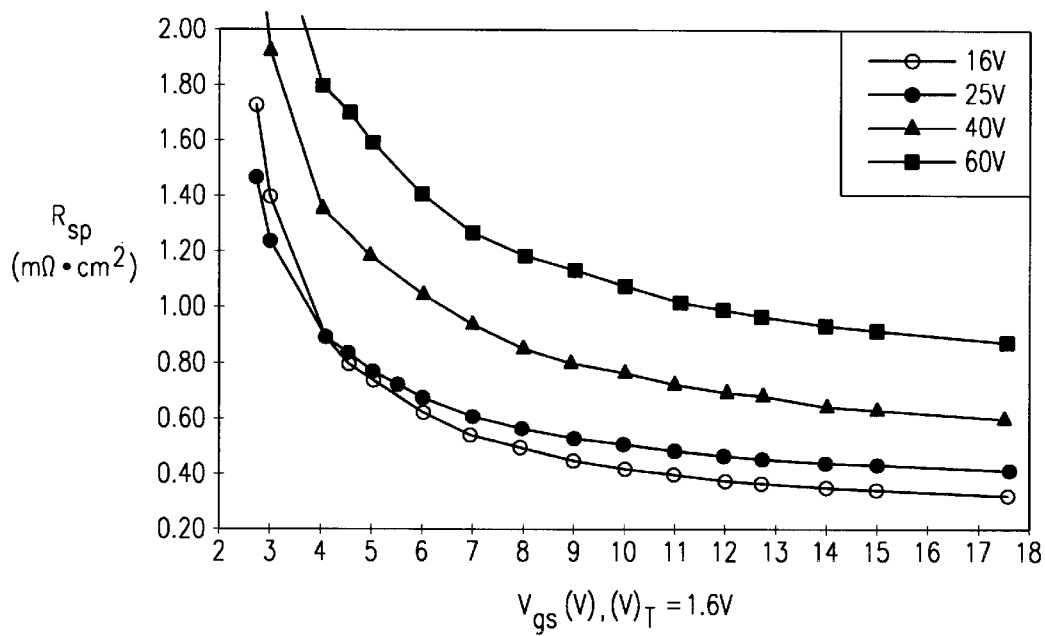
FIGS. 7 and 8 summarize BV and Rsp characteristics of various embodiments of the invention.

FIGS. 7 and 8 summarize the Rsp characteristics of the above-described LDMOS devices 10, 50, and 60, over a range of Vgs values. The Rsp for a 40V device, which is configured like the high voltage 60V device 10, is also illustrated. These results were obtained with computer models of the various designs.

Other Embodiments

Although the present invention has been described in detail, it should be understood that various changes, substitutions and alterations can be made hereto without departing from the spirit and scope of the invention as defined by the appended claims.

What is claimed is:

1. A low-side LDMOS device, comprising:
    a semiconductor layer of a first conductivity type;
    a second region of a second conductivity type opposite said first conductivity type formed as a well in said semiconductor layer;
    a third region having a first subregion of said first conductivity type and a second subregion of said second conductivity type, wherein said first subregion is deeper than said second subregion, and wherein said third region is formed as a well in said second region
    a source region of said second conductivity type formed in said second subregion of said third region;
    a drain region of said second conductivity type formed in said second region and spaced apart from said source region, such that a channel is formed between said source region and said drain region;
    a backgate region formed in said third region and adjacent said source region such that said source region separates said backgate region and said channel, said backgate region being of said first conductivity type;
    a gate oxide layer over said channel; and
    a gate over at least part of said source region and said channel;
    wherein said third region is sufficiently sized such that the edge of said second subregion is implanted under said gate and extends laterally past said source region.

2. The device of claim 1, wherein said first conductivity type is p type and said second conductivity is n type.

3. The device of claim 1, wherein said source region has a dopant concentration greater than that of said second region.

4. The device of claim 1, wherein said drain region has a dopant concentration greater than that of said second region.

5. The device of claim 1, wherein said second region is a low dopant concentration high-voltage region.

6. The device of claim 1, wherein said gate oxide layer is planar over said device.

7. The device of claim 1, wherein said gate oxide layer has thick field oxide regions between said channel and said drain region.

8. The device of claim 7, further comprising a channel-stop region of said second conductively type in under said thick field oxide region.

9. The device of claim 7, further comprising a well of said second conductivity type under said thick field oxide region and under said drain region.

10. A high-side LDMOS device, made from a semiconductor materials of a first conductivity type and a second conductivity type, comprising:
    a barrier layer of said second conductivity type located over a substrate;
    a second region of said second conductivity type formed as a well in said barrier layer;
    a third region having a first subregion of said first conductivity type and a second subregion of said second conductivity type, formed as a well in said second region a source region of said second conductivity type formed in said second subregion of said third region;

a drain region of said second conductivity type formed in said second region and spaced apart from said source region, such that a channel is formed between said source region and said drain region;

a backgate region formed in said third region and adjacent said source region such that said source region separates said backgate region and said channel, said backgate region being of said first conductivity type;

a gate oxide layer over said channel; and a gate over at least part of said source region and said channel;

wherein said third region is sufficiently sized such that the edge of said second subregion is implanted under said gate and extends laterally past said source region.

11. An LDMOS device, comprising:

a semiconductor layer of a first conductivity type:

a deep well of a second conductivity type within the semiconductor layer;

a double-diffused well (DWELL) in said deep well, said DWELL having a first conductivity type region and a second conductivity type region;

a source region of said second conductivity type located in said second conductivity type region of said DWELL;

a drain region of said second conductivity type located in said deep well and spaced from said source region such that a channel region is formed between said source region and said drain region;

a backgate region of said first conductivity type located in said DWELL;

a gate dielectric layer over said channel region;

a gate electrode over said gate dielectric, said gate electrode extending over at least a part of said source region and said channel;

wherein said DWELL is sufficiently sized such that an edge of said second conductivity type region extends laterally past said source region under said gate.

* * * * *